(12) United States Patent
Bharadwaj et al.

(10) Patent No.: US 10,048,354 B2
(45) Date of Patent: Aug. 14, 2018

(54) CHIRP FREQUENCY NON-LINEARITY MITIGATION IN RADAR SYSTEMS

(71) Applicant: Texas Instruments Incorporated, Dallas, TX (US)

(72) Inventors: Sachin Bharadwaj, Bangalore (IN); Karthik Subburaj, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 436 days.

(21) Appl. No.: 14/826,045

(22) Filed: Aug. 13, 2015

(65) Prior Publication Data

US 2017/0045607 A1     Feb. 16, 2017

(51) Int. Cl.
| | |
|---|---|
| G01S 7/35 | (2006.01) |
| G01S 13/42 | (2006.01) |
| G01S 13/58 | (2006.01) |
| G01S 7/40 | (2006.01) |
| G01S 13/34 | (2006.01) |
| H03L 7/06 | (2006.01) |

(52) U.S. Cl.
CPC .............. G01S 7/35 (2013.01); G01S 7/4008 (2013.01); G01S 13/343 (2013.01); G01S 13/583 (2013.01); H03L 7/06 (2013.01); *G01S 13/584* (2013.01)

(58) Field of Classification Search
CPC .............. G01S 7/35; G01S 7/40; G01S 7/4021
USPC .......................................................... 342/70
See application file for complete search history.

(56) References Cited

U.S. PATENT DOCUMENTS

| | | | |
|---|---|---|---|
| 7,068,216 B2 | 6/2006 | Kliewer et al. | |
| 8,654,006 B2 * | 2/2014 | Landez | G01S 7/032 |
| | | | 342/103 |
| 9,097,791 B2 * | 8/2015 | Kishigami | G01S 7/285 |
| 2007/0164828 A1 * | 7/2007 | Uozumi | H03C 3/0925 |
| | | | 331/16 |
| 2011/0181458 A1 | 7/2011 | Feil | |
| 2015/0177364 A1 | 6/2015 | Rhee et al. | |

OTHER PUBLICATIONS

International Search Report for corresponding PCT Application No. PCT/US2016/046870, dated Nov. 3, 2016 (2 pages).

\* cited by examiner

*Primary Examiner* — Vladimir Magloire
*Assistant Examiner* — Helena H Seraydaryan
(74) *Attorney, Agent, or Firm* — John R. Pessetto; Charles A. Brill; Frank D. Cimino

(57) ABSTRACT

The disclosure provides a radar apparatus. The radar apparatus includes a transmit unit that generates a first signal in response to a reference clock and a feedback clock. The first signal is scattered by one or more obstacles to generate a second signal. A receive unit receives the second signal and generates N samples corresponding to the second signal. N is an integer. A conditioning circuit is coupled to the transmit unit and the receive unit. The conditioning circuit receives the N samples corresponding to the second signal, and generates N new samples using an error between the feedback clock and the reference clock.

18 Claims, 3 Drawing Sheets

CHIRP FREQUENCY NON-LINEARITY MITIGATION IN RADAR SYSTEMS

TECHNICAL FIELD

The present disclosure relate generally to radars and more particularly to mitigation of non-linearity of chirps generated in radars.

BACKGROUND

The use of radars in automotive and industrial applications is evolving rapidly. Radar finds use in number of applications associated with a vehicle such as collision warning, blind spot warning, lane change assist, parking assist and rear collision warning. In industrial environment, radar finds use in determining relative position and relative velocity of obstacles around the radar. Pulse radar and FMCW (Frequency Modulated Continuous Wave) radar are predominately used in such applications.

In an FMCW radar, a synthesizer generates a ramp segment by frequency modulating a transmit signal. The ramp segment is also referred as a chirp signal. The ramp segment is amplified and emitted by one or more transmit units. The ramp segment is scattered by one or more obstacles to generate a scattered signal. The scattered signal is received by one or more receive units in the FMCW radar. A signal obtained by mixing the ramp segment and the scattered signal is termed as an IF (intermediate frequency) signal. The frequency (f) of the IF signal is proportional to the distance (d) of the obstacle from the FMCW radar and also to the slope (S) of the ramp segment.

The IF signal is sampled by an ADC (analog to digital converter). A sampled data generated by the ADC is processed by processor to obtain a position and a velocity of one or more obstacles. In one kind of FMCW radar, the processor performs FFT (fast fourier transform) on the sampled data. A peak in the FFT spectrum represents an obstacle and a location of the peak in the FFT spectrum is proportional to a relative distance of the obstacle from the FMCW radar.

An ideal synthesizer generates a linear ramp segment i.e. frequency varies linearly with time. A corresponding FFT spectrum obtained provides the information of the one or more obstacles. However, practical synthesizer generates a non-linear chirp signal due to finite settling time of the synthesizer. A non-linear chirp signal is one whose frequency does not vary linearly with time. The non-linearity in the chirp signal results in smearing (or overlapping) of peaks in the FFT spectrum which makes the detection of closely spaced obstacles difficult. Further, the smearing of peaks results in ghost objects since a point object will appear as multiple objects. Ghost objects are objects falsely detected by the FMCW radar which are not present in reality. The frequency non-linearity in the chirp signal therefore results in false detection of ghost objects and failure of detection of objects present in reality.

SUMMARY

According to an aspect of the disclosure, a radar apparatus is disclosed. The radar apparatus includes a transmit unit that generates a first signal in response to a reference clock and a feedback clock. The first signal is scattered by one or more obstacles to generate a second signal. A receive unit receives the second signal and generates N samples corresponding to the second signal. N is an integer. A conditioning circuit is coupled to the transmit unit and the receive unit. The conditioning circuit receives the N samples corresponding to the second signal, and generates N new samples using an error between the feedback clock and the reference clock.

BRIEF DESCRIPTION OF THE VIEWS OF DRAWINGS

DETAILED DESCRIPTION OF THE EMBODIMENTS

Figure 1:
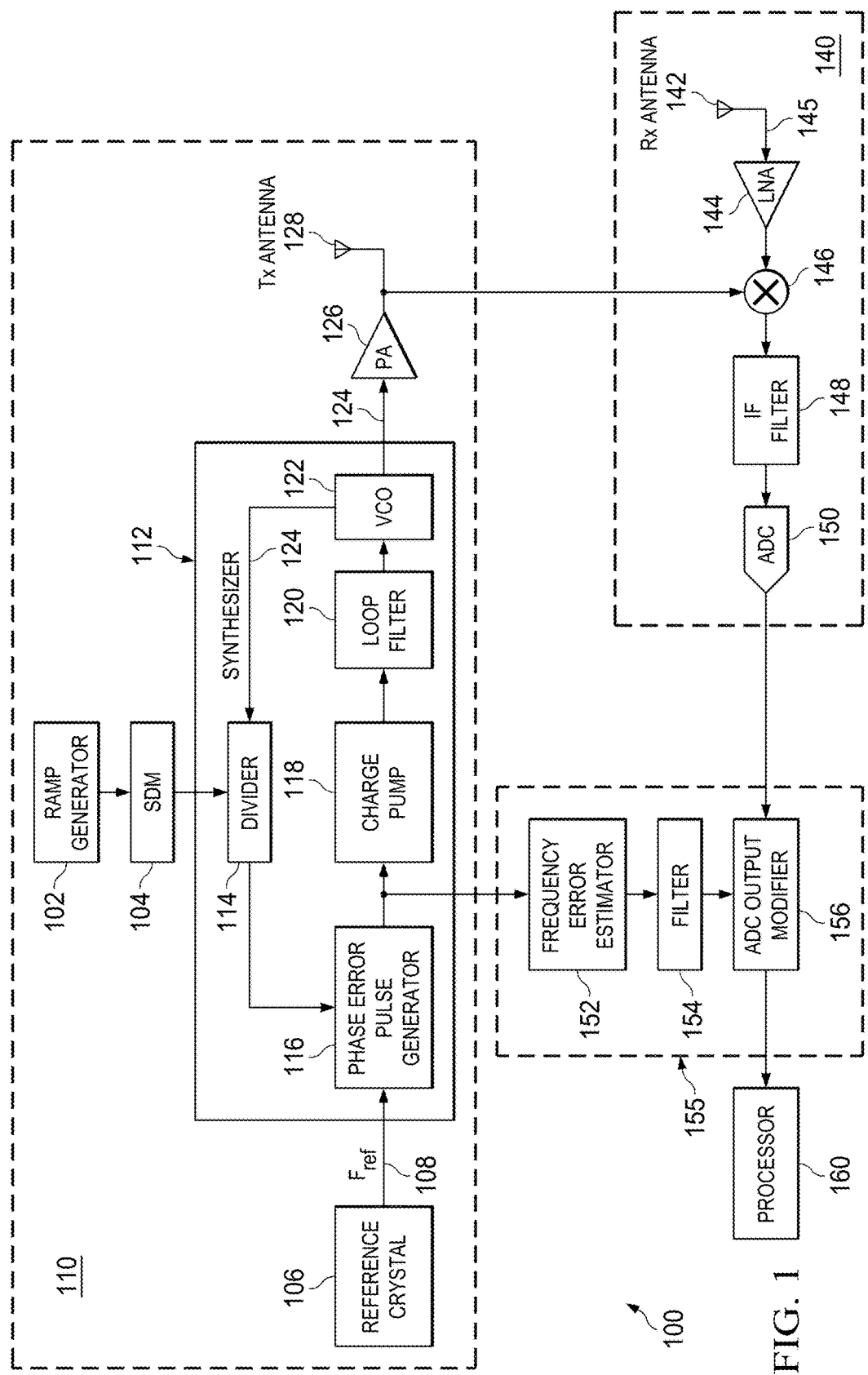
FIG. 1 illustrates a radar apparatus, according to an embodiment.

FIG. 1 illustrates a radar apparatus 100, according to an embodiment. The radar apparatus 100 includes a transmit unit 110, a receive unit 140, a conditioning circuit 155 and a processor 160. The transmit unit 110 includes a ramp generator 102. A sigma-delta modulator (SDM) 104 is coupled to the ramp generator 102. A synthesizer 112 is coupled to the SDM 104. A reference crystal 106 generates a reference clock $F_{ref}$ 108, and provides the reference clock $F_{ref}$ 108 to the synthesizer 112. A power amplifier (PA) 126 is coupled to the synthesizer 112. A transmit antenna unit 128 is coupled to the PA 126. In one example, the transmit unit 110 includes a plurality of transmit antenna units.

The synthesizer 112 includes a divider 114, a phase error pulse generator 116, a charge pump 118, a loop filter 120 and a VCO (voltage controlled oscillator) 122. The phase error pulse generator 116 is coupled to the divider 114 and the reference crystal 106. The charge pump 118 is coupled to the phase error pulse generator 116, and the loop filter 120 is coupled to the charge pump 118. The VCO 122 is coupled to the loop filter 120. An output of the VCO 122 is provided to the divider 114 as a feedback. The PA 126 receives the output of the VCO 122.

The receive unit 140 includes a receive antenna unit 142, a (LNA) low noise amplifier 144, a mixer 146, an IF (intermediate frequency) filter 148 and an ADC (analog to digital converter) 150. The LNA 144 is coupled to the receive antenna unit 142. The mixer 146 is coupled to the transmit unit 110 and to the LNA 144. The IF filter 148 is coupled to the mixer 146, and the ADC 150 is coupled to the IF filter 148.

The radar apparatus 100 includes the conditioning circuit 155. The conditioning circuit 155 is coupled to the transmit unit 110 and the receive unit 140. The conditioning circuit 155 includes a frequency error estimator 152, a filter 154 and an ADC output modifier 156. The frequency error estimator 152 is coupled to the phase error pulse generator 116 in the transmit unit 110. The filter 154 is coupled to the frequency error estimator 152, and the ADC output modifier 156 is coupled to the filter 154. In one version, the filter 154 is a low pass filter. A processor 160 is coupled to the ADC output modifier 156. In one version, the ADC output modifier 156 is part of the processor 160. The radar apparatus 100 as illustrated has one transmit unit and one receive unit. In another example, the radar apparatus 100 includes multiple transmit units and multiple receive units. The radar apparatus 100 may include one or more additional components known to those skilled in the relevant art and are not discussed here for simplicity of the description.

The operation of the radar apparatus 100 illustrated in FIG. 1 is explained now. The phase error pulse generator 116 receives the reference clock $F_{ref}$ 108, and a feedback clock from the divider 114. The reference clock $F_{ref}$ 108 is a constant frequency signal. The phase error pulse generator 116 generates a pulse once in every time period of the reference clock $F_{ref}$ 108. The phase error pulse generator 116 also generates an additional digital signal that denotes whether the feedback clock is leading or lagging in phase as compared to the reference clock $F_{ref}$ 108. The pulse along with the additional digital signal generated by the phase error pulse generator 116 represents an error between the feedback clock and the reference clock $F_{ref}$ 108. Thus, the phase error pulse generator 116 estimates the error between the feedback clock and the reference clock $F_{ref}$ 108. The error between the feedback clock and the reference clock $F_{ref}$ 108 represents a time difference between a positive edge of the feedback clock and a positive edge of the reference clock $F_{ref}$ 108.

The charge pump 118 generates a voltage signal in response to the error received from the phase error pulse generator 116. The voltage signal is proportional to a phase error between the feedback clock and the reference clock $F_{ref}$ 108. The loop filter 120 attenuates the voltage signal received from the charge pump 118 to filter a high frequency noise, and thus generates a low frequency signal.

The VCO 122 generates a first signal 124. The VCO 122 alters an output phase and a frequency of the first signal 124 based on the low frequency signal received from the loop filter 120. Thus, the first signal 124 is phase locked to the reference clock $F_{ref}$ 108, and hence the phase error is eliminated. The frequency of the first signal 124 generated by the VCO 122 is proportional to a frequency of the reference clock $F_{ref}$ 108. In one example, the frequency of the first signal 124 is 80 GHz, and the frequency of the reference clock $F_{ref}$ 108 is 12 GHz. Therefore, proportionality constant is 6.667 (when 80 is divided by 12). The first signal 124 is also provided to the divider 114 as a feedback.

Since, the frequency of the first signal 124 is related to the frequency of the reference clock $F_{ref}$ 108 by the proportionality constant, the divider 114 is configured to divide the first signal 124 by the proportionality constant. The ramp generator 102 generates a fractional division control word. The fractional division control word is, in one example, a fractional number by which the first signal 124 is to be divided. The sigma-delta modulator (SDM) 104 generates an integer division control word which is a sequence of integers from the fractional division control word.

The divider 114 in the synthesizer 112 receives the integer division control word and the first signal 124. The divider 114 divides the first signal 124 by the integer division control word to generate the feedback clock. In one version, the fractional division control word is 6.667 which is equal to the proportionality constant. The SDM 104 generates the sequence of integers (6,7,7) from the fractional division control word. The sequence of integers divides the first signal 124 by 6, 7, 7 respectively, thereby generating the feedback clock. The divider 114 divides the first signal 124 to generate the feedback clock whose frequency matches the frequency of the reference clock $F_{ref}$ 108.

The power amplifier (PA) 126 receives the first signal 124 from the synthesizer 112 and amplifies the first signal 124. In one version, the PA 126 performs one or more of the following operation on the first signal 124: frequency multiplication or division, phase and/or frequency modulation and amplification. The first signal 124 is transmitted by the transmit antenna unit 128. In an example, the first signal 124 is a ramp segment also called as chirp. The chirp has a starting frequency and a slope. The starting frequency is a frequency at the beginning of the chirp. The slope of the chirp is a rate of change of frequency of the chirp during duration of the chirp. An ideal slope is a desired slope of the chirp. The first signal 124 is scattered by one or more obstacles to generate a second signal 145.

The receive unit 140 receives the second signal 145. The second signal 145, in one version, is a ramp segment. The receive antenna unit 142 receives the second signal 145. The LNA 144 amplifies the second signal 145. The mixer 146 is configured to mix the second signal 145 and the first signal 124 to generate an IF (intermediate frequency) signal. The IF filter 148 generates a filtered IF signal from the IF signal. In one version, the IF filter 148 filters the IF signal to generate the filtered IF signal. The ADC 150 samples the filtered IF signal to generate N samples corresponding to the second signal 145.

The frequency error estimator 152 is coupled to the phase error pulse generator 116 in the transmit unit 110. The frequency error estimator 152 generates an instantaneous frequency error signal from the error between the feedback clock and the reference clock $F_{ref}$ 108. The filter 154 low pass filters the instantaneous frequency error signal to generate a filtered frequency error signal. The filtered frequency error signal represents a difference between a desired frequency of the first signal 124 and an actual frequency of first signal 124 generated by the synthesizer 112. A slope of the first signal 124 at a given instant is referred as instantaneous slope. A slope error is proportional to the filtered frequency error signal. The slope error is a difference between the instantaneous slope of the first signal 124 and the ideal slope. The slope error represents a rate of change of filtered frequency error signal over time.

The ADC output modifier 156 receives the N samples corresponding to the second signal 145 from the ADC 150. N is an integer. In one example, the filter 154 is part of the frequency error estimator 152, and the frequency error estimator 152 generates the filtered frequency error signal.

The ADC output modifier 156 generates a new sampling time instants of the N samples from the filtered frequency error signal. The ADC output modifier 156 also estimates coefficients of a polynomial to be fitted to the N samples using the new sampling time instants. The ADC output modifier 156 resamples the N samples using the estimated coefficients, and generates the N new samples. Thus, the conditioning circuit 155 receives the N samples corresponding to the second signal 145 from the receive unit 140 and generates N new samples using the error between the feedback clock and the reference clock $F_{ref}$ 108.

The processor 160 determines a position and a velocity of the one or more obstacles from the N new samples. The radar apparatus 100 provides for real time estimation of non-linearity in the first signal 124 or the chirp. A frequency non-linearity in the transmitted first signal 124 is also present as a sampling time jitter in the IF signal generated in the receive unit 140. This sampling time jitter is estimated in the synthesizer 112, the frequency error estimator 152 and the filter 154. The sampling time jitter is corrected in the ADC output modifier 156.

The radar apparatus 100 utilizes the phase error pulse generator 116 in the synthesizer 112 to estimate the non-linearity in the first signal 124. The radar apparatus 100 does not estimates polynomial coefficients for the ADC output modifier 156. Also, the radar apparatus 100 does not require a known reference target to estimate the non-linearity in the first signal 124. The radar apparatus 100 can work without any offline calibration for the non-linearity in the first signal 124.

In one example, the radar apparatus 100 utilizes offline calibration. In offline calibration, the filtered frequency error signal generated by the filter 154 is stored in a non-volatile memory. The filtered frequency error signal is averaged over multiple chirps before storing in the non-voltage memory. This storage is performed during or after manufacturing of the radar apparatus 100 i.e. before the radar apparatus 100 is deployed on-field or before the radar apparatus 100 is put into use. The filtered frequency error signal generated by the filter 154 during actual operation is then rejected by the ADC output modifier 156. The ADC output modifier 156 uses the data stored in the non-volatile memory. This improves an accuracy of the radar apparatus 100.

In another example, the radar apparatus 100 utilizes pseudo offline calibration. The pseudo offline calibration is performed when the radar apparatus 100 has been deployed on-field. Even before the first signal 124 (or the chirp) is transmitted by the transmit antenna unit 128, the filtered frequency error signal generated by the filter 154 is stored in a non-volatile memory. The filtered frequency error signal is averaged over multiple chirps before storing in the non-voltage memory. The filtered frequency error signal generated by the filter 154 during actual operation is then rejected by the ADC output modifier 156. The ADC output modifier 156 uses the data stored in the non-volatile memory.

The radar apparatus 100 generates the first signal 124 which is non-linear. Thus, the first signal 124 is a non-linear chirp. The phase error pulse generator 116 in the synthesizer 112 estimates the non-linearity in the first signal 124. The frequency error estimator 152 generates an instantaneous frequency error signal from the error between the feedback clock and the reference clock $F_{ref}$ 108. The filter 154 low pass filters the instantaneous frequency error signal to generate a filtered frequency error signal.

The non-linearity in the first signal 124 is compensated by processing an output of the ADC 150 based on the filtered frequency error signal. As discussed earlier, the slope error is proportional to the filtered frequency error signal. The non-linearity in the first signal 124 is compensated in the following way. When the instantaneous slope is different from the ideal slope, the N samples obtained from the ADC 150 are skipped or interpolated. For example, when the instantaneous slope is half of the ideal slope, alternate samples of the N samples obtained from the ADC 150 are skipped. When the instantaneous slope is twice of the ideal slope, the N samples obtained from the ADC 150 are interpolated by two to generate new samples. The skipping and interpolation are performed finely through digital resampling of the N samples from the ADC 150 to generate the N new samples.

Figure 2:
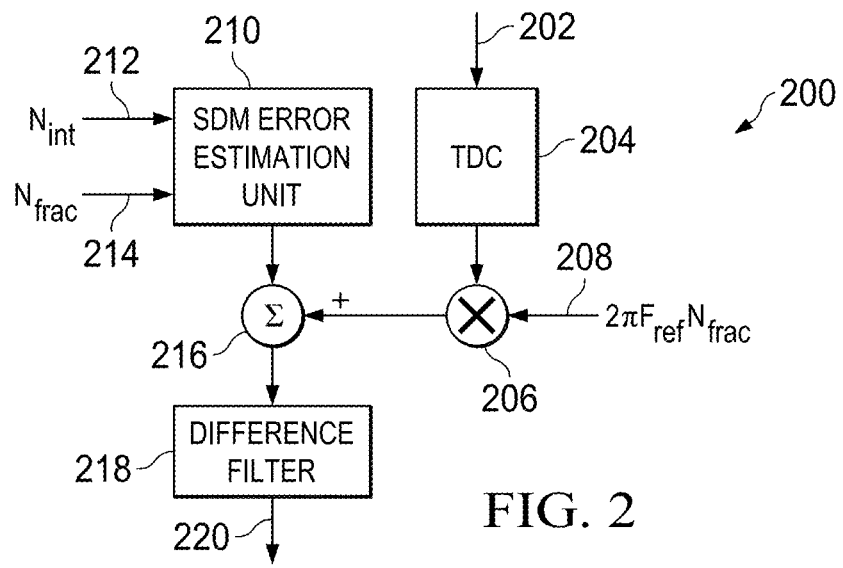
FIG. 2 illustrates a block diagram of a frequency error estimator, according to an embodiment.

FIG. 2 illustrates a block diagram of a frequency error estimator 200, according to an embodiment. The frequency error estimator 200 is analogous to the frequency error estimator 152 in connection and operation. The frequency error estimator 200 includes a TDC (time-to-delay converter) 204. A multiplier 206 is coupled to the TDC 204.

A sigma-delta modulator (SDM) error estimation unit 210 receives an integer division control word $N_{int}$ 212 and a fractional division control word $N_{frac}$ 214. The integer division control word $N_{int}$ 212 is similar to the integer division control word generated by the ramp generator 102. The fractional division control word $N_{frac}$ 214 is similar to the fractional division control word generated by the SDM 104. A subtractor 216 is coupled to the multiplier 206 and the SDM error estimation unit 210. A difference filter 218 is coupled to the subtractor 216.

The operation of the frequency error estimator 200 illustrated in FIG. 2 is explained now. It is understood that the following solution is one of the many ways of implementing frequency error estimator 200 and variations, and alternative constructions are apparent and well within the spirit and scope of the disclosure. The frequency error estimator 200 is explained in connection with the radar apparatus 100 (illustrated in FIG. 1). The first signal 124 transmitted by the transmit unit 110 is a non-linear signal and hence, also referred as non-linear chirp signal. A phase of the first signal 124 transmitted by the transmit unit 110 is defined as:

$$\phi^{non\text{-}ideal}(t) = 2\pi f_c t + 2\pi \frac{B}{T_r} \frac{t^2}{2} + \phi_e(t) \tag{1}$$

where, B is a bandwidth of the first signal, $T_r$ is a duration of the first signal, $f_c$ is a start frequency of the first signal and $\phi_e(t)$ is an instantaneous non-linearity in the transmitted first signal which is defined as:

$$\phi_e(t) = 2\pi \int_0^t f_e(t) \partial t \tag{2}$$

where, $f_e$ is an instantaneous frequency of the first signal 124. The first signal 124 is scattered by one or more obstacles to generate the second signal 145.

The second signal 145 is received by the receive unit 140 after a delay $t_d$. The mixer 146 mixes the first signal 124 from the transmit unit 110 and the second signal 145 to generate the IF (intermediate frequency) signal. A phase of the IF signal is defined as:

$$\Delta\phi^{non\text{-}ideal}(t) = \phi^{non\text{-}ideal}(t - t_d) - \phi^{non\text{-}ideal}(t) = \tag{3}$$
$$-2\pi f_c t_d + \frac{\pi B}{T_r}[(t - t_d)^2 - t^2] + \varphi_e(t - t_d) - \varphi_e(t)$$

Using Taylor Series expansion for equation 3, $$\varphi_e(t - t_d) \approx \varphi_e(t) - t_d \frac{\partial \varphi_e(t)}{\partial t} = \varphi_e(t) - 2\pi t_d f_e(t), \tag{4}$$

$$\Delta\phi^{non\text{-}ideal}(nT_s) = \phi_o - 2\pi S t_d \left(nT_s + \frac{f_e(nT_s)}{S}\right) \text{ where } S = \frac{B}{T_r} \tag{5}$$

where, $T_s$ is a sampling time period of the ADC 150. Equation 5 illustrates that the non-linearity in the first signal 124 results in sampling of the IF signal at incorrect time instance. This is referred as sampling jitter.

A non-linearity in the first signal 124 also occurs at an output of the phase error pulse generator 116. The TDC 204 is coupled to the phase error pulse generator 116 and receives an error between the feedback clock and the reference clock $F_{ref}$ 108. The TDC 204 converts the error between the feedback clock and the reference clock $F_{ref}$ 108 to a phase error.

The multiplier 206 converts the phase error to a first signal phase error by multiplying with $2\pi F_{ref} N_{frac}$, where $F_{ref}$ is the reference clock 108 and $N_{frac}$ is the fractional division control word 214. Thus, the first signal phase error is defined as:

$$\tilde{\phi}_{err}[nT_{ref}] = 2\pi F_{ref} N_{frac} t_{err}^{TDC}[nT_{ref}] \qquad (6)$$

where, $t_{err}^{TDC}$ is a quantized version of the error between the feedback clock and the reference clock $F_{ref}$ 108.

The SDM error estimation unit 210 estimates an additional phase error associated with the sigma-delta modulator 104. The sigma-delta modulator 104 induces quantization error which is systematic in nature and is compensated from the first signal phase error using the subtractor 216. The additional phase error is defined as:

$$\text{sdm\_err}[n] = 2\pi \sum_{n=0}^{N} \left(1 - \frac{N_{frac}[n]}{N_{int}[n]}\right) \qquad (7)$$

The subtractor 216 subtracts the additional phase error from the first signal phase error to generate an instantaneous phase error which is defined as:

$$\phi_{err}[nT_{ref}] 2\pi F_{ref} N_{frac} t_{err}^{TDC}[nT_{ref}] - \text{sdm\_err}[nT_{ref}] \qquad (8)$$

The difference filter 218 generates an instantaneous frequency error signal 220 by differentiating the instantaneous phase error as defined below:

$$f_e[n] = \phi_{err}[n] - \phi_{err}[n-1] \qquad (9)$$

The filter 154 low pass filters the instantaneous frequency error signal to generate a filtered frequency error signal. The sampling jitter in the IF signal as illustrated in equation 5 is corrected through the ADC output modifier 156 using the instantaneous frequency error signal 220 illustrated in equation 9.

The IF filter 148 generates a filtered IF signal from the IF signal. The ADC 150 samples the filtered IF signal to generate N samples corresponding to the second signal 145. The N samples are obtained for $T_r$ which is the duration of the first signal 124. These samples along with their new sampling time instants (obtained from filtered frequency error signal as illustrated in equation 9) are provided to the ADC output modifier 156. In one example, the ADC output modifier is a $3^{rd}$ order ADC output modifier.

A $3^{rd}$ order ADC output modifier requires 4 successive samples of the N samples for polynomial evaluation. The coefficients for polynomial expansion are estimated using a closed-form matrix inversion defined as:

$$\underbrace{\begin{bmatrix} y(T_{in}[1]) \\ y(T_{in}[2]) \\ y(T_{in}[3]) \\ y(T_{in}[4]) \end{bmatrix}}_{\text{Incoming samples}} = \underbrace{\begin{bmatrix} 1 & T_{in}[1] & T_{in}^2[1] & T_{in}^3[1] \\ 1 & T_{in}[2] & T_{in}^2[2] & T_{in}^3[2] \\ 1 & T_{in}[3] & T_{in}^2[3] & T_{in}^3[3] \\ 1 & T_{in}[4] & T_{in}^2[4] & T_{in}^3[4] \end{bmatrix}}_{\text{Vander Monde Matrix}} \underbrace{\begin{bmatrix} a_0 \\ a_1 \\ a_2 \\ a_3 \end{bmatrix}}_{\text{Polynominal Coefficinet}} \qquad (10)$$

where $y(T_{in}[n])$ is the $n^{th}$ sample from the ADC 150 and $T_{in}[n]$ is defined in equation 5. Once the coefficients {a0, a1,a2,a3} for polynomial fit are known using equation 9, the polynomial is evaluated at desired time instants $mT_s$ defined as $$\hat{y}(mT_s) = a_0 + a_1(mT_s) + a_2(mT_s)^2 + a_3(mT_s)^3 \qquad (11)$$

Thus, the radar apparatus 100 is able to efficiently determine a position and a velocity of one or more obstacles from $\hat{y}(mT_s)$ instead of using samples from the ADC 150. In one embodiment, the SDM error estimation unit 210 is not part of the frequency error estimator 200.

Figure 3:
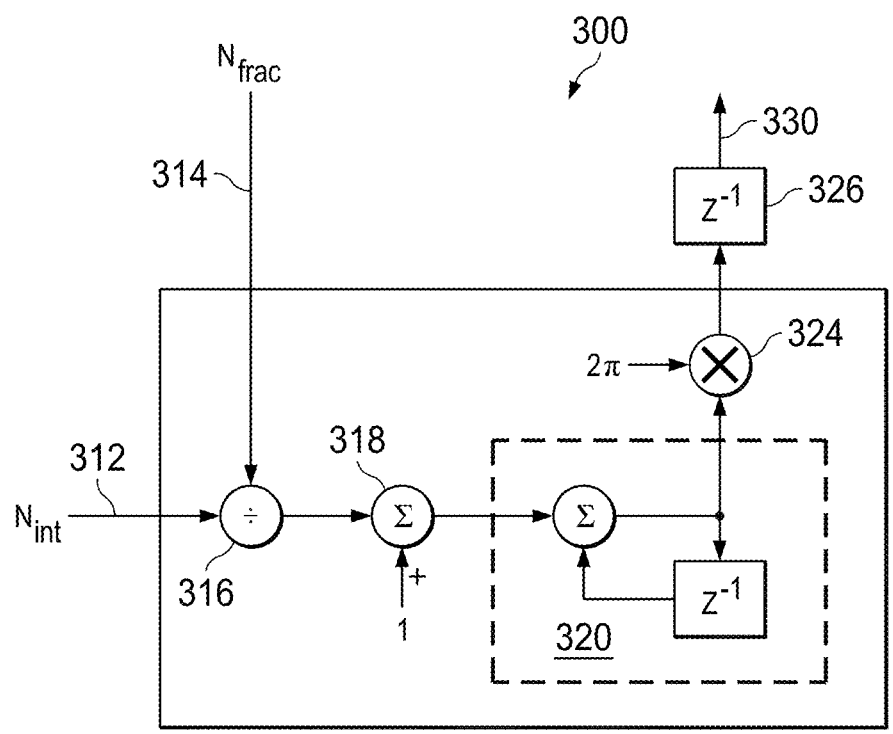
FIG. 3 illustrates a block diagram of a sigma-delta modulator error estimation unit, according to an embodiment.

FIG. 3 illustrates a block diagram of a sigma-delta modulator (SDM) error estimation unit 300, according to an embodiment. The SDM error estimation unit 300 is analogous to the sigma-delta modulator (SDM) error estimation unit 210 (illustrated in FIG. 2) in connection and operation. The SDM error estimation unit 300 receives the integer division control word $N_{int}$ 312 and the fractional division control word $N_{frac}$ 314.

A division unit 316 divides the fractional division control word $N_{frac}$ 314 by the integer division control word $N_{int}$ 312 to generate a division ratio. A subtraction unit 318 subtracts the division ratio from 1 to generate a subtracted output. An integrator unit 320 integrates the subtracted output for N samples to generate an integrated output.

A multiplier 324 is used to multiply the integrated output by a constant to generate a modified integrated output. In one example, the constant is $2\pi$. A delay unit 326 receives an output of the multiplier 324 and generates an additional phase error 330 from the modified integrated output. In one example, the delay unit 326 generates an additional phase error 330 by delaying the modified integrated output. The additional phase error 330 is associated with the sigma-delta modulator 104 (illustrated in FIG. 1). The additional phase error 330 is defined as:

$$\text{sdm\_err}[n] = 2\pi \sum_{n=0}^{N} \left(1 - \frac{N_{frac}[n]}{N_{int}[n]}\right) \qquad (12)$$

Figure 4:
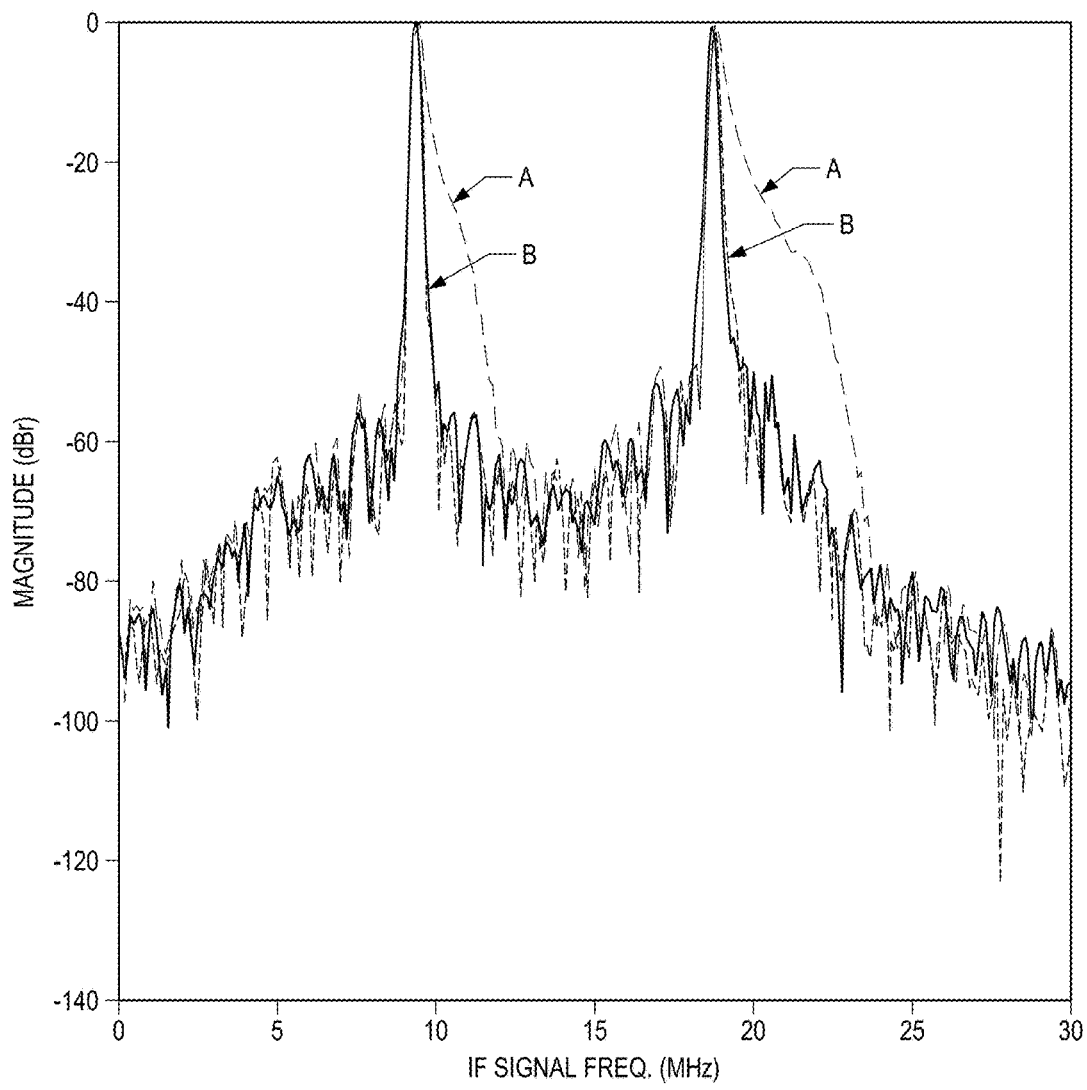
FIG. 4 illustrates waveforms that illustrate an FFT output obtained in a radar apparatus, according to an embodiment.

FIG. 4 illustrates waveforms that illustrate an FFT output obtained in a radar apparatus, according to an embodiment. The waveform A illustrates an FFT output obtained in a conventional radar apparatus. As illustrated, waveform A illustrates smearing of peaks resulting in ghost objects and hence false detection. The smearing of peaks is a result of non-linearity in a ramp segment transmitted by the conventional radar apparatus.

The waveform B illustrates an FFT output obtained in the radar apparatus 100. Although the first signal 124 (or the ramp segment) transmitted by the radar apparatus 100 is non-linear, the problem of smearing of peaks in the radar apparatus 100 does not occur since the apparatus 100 employs real-time chirp linearity mitigation. The peaks obtained in the FFT output represent point objects at a defined distance from the radar apparatus 100.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections. It is to be noted that the terms 'object' and 'obstacle' have been used interchangeably in this disclosure.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. A radar apparatus comprising:
    a transmit unit configured to generate a first signal in response to a reference clock and a feedback clock, wherein the first signal is scattered by one or more obstacles to generate a second signal;
    a receive unit configured to receive the second signal and configured to generate N samples corresponding to the second signal, wherein N is an integer; and
    a conditioning circuit coupled to the transmit unit and the receive unit, the conditioning circuit configured to receive the N samples corresponding to the second signal, and configured to generate N new samples using an error between the feedback clock and the reference clock.

2. The radar apparatus of claim 1, wherein the transmit unit comprises:
    a ramp generator configured to generate a fractional division control word;
    a sigma-delta modulator coupled to the ramp generator and configured to generate an integer division control word from the fractional division control word;
    a reference crystal configured to generate the reference clock;
    a synthesizer configured to receive the reference clock and the integer division control word and configured to generate the first signal;
    a power amplifier configured to amplify the first signal; and
    a transmit antenna unit coupled to the power amplifier and configured to transmit the first signal.

3. The radar apparatus of claim 2, wherein the synthesizer comprises:
    a divider configured to divide the first signal by the integer division control word to generate the feedback clock;
    a phase error pulse generator configured to estimate the error between the feedback clock and the reference clock;
    a charge pump coupled to the phase error pulse generator and configured to generate a voltage signal in response to the error;
    a loop filter coupled to the charge pump and configured to filter a high frequency noise from the voltage signal to generate a low frequency signal; and
    a VCO (voltage controlled oscillator) coupled to the loop filter and configured to generate the first signal in response to the low frequency signal.

4. The radar apparatus of claim 1, wherein the receive unit comprises:
    a receive antenna unit configured to receive the second signal;
    a LNA (low noise amplifier) coupled to the receive antenna unit and configured to amplify the second signal;
    a mixer coupled to the LNA and the transmit unit, the mixer configured to mix the second signal and the first signal to generate an IF (intermediate frequency) signal;
    an IF filter configured to generate a filtered IF signal from the IF signal; and
    an ADC (analog to digital converter) coupled to the IF filter and configured to sample the filtered IF signal to generate the N samples corresponding to the second signal.

5. The radar apparatus of claim 1, wherein the conditioning circuit comprises:
    a frequency error estimator coupled to the transmit unit and configured to generate an instantaneous frequency error signal from the error between the reference clock and the feedback clock;
    a filter coupled to the frequency error estimator and configured to low pass filter the instantaneous frequency error signal to generate a filtered frequency error signal; and
    an ADC output modifier coupled to the filter and the receive unit, the ADC output modifier configured to:
        generate a new sampling time instants of the N samples from the filtered frequency error signal;
        estimate coefficients of a polynomial to be fitted to the N samples using the new sampling time instants; and
        resample the N samples using the estimated coefficients and generate the N new samples.

6. The radar apparatus of claim 5, wherein the frequency error estimator comprises:
    a TDC (time-to-delay converter) coupled to the transmit unit and configured to convert the error between the feedback clock and the reference clock to a phase error;
    a multiplier coupled to the TDC and configured to convert the phase error to a first signal phase error;
    a sigma-delta modulator error estimation unit configured to estimate an additional phase error;
    a subtractor configured to subtract the additional phase error from the first signal phase error to generate an instantaneous phase error; and
    a difference filter coupled to the subtractor and configured to generate the instantaneous frequency error signal by differentiating the instantaneous phase error.

7. The radar apparatus of claim 6, wherein the sigma-delta modulator error estimation unit is configured to estimate the additional phase error from the fractional division control word and the integer division control word.

8. The radar apparatus of claim 6, wherein the sigma-delta modulator error estimation unit comprises:
    a division unit configured to divide the fractional division control word by the integer division control word to generate a division ratio;
    a subtraction unit coupled to the division unit and configured to subtract the division ratio from one to generate a subtracted output;
    a integrator unit coupled to the subtraction unit and configured to integrate the subtracted output for N samples to generate an integrated output;
    a multiplier coupled to the integrator unit and configured to multiply the integrated output by a constant to generate a modified integrated output; and
    a delay unit coupled to the multiplier, and configured to estimate the additional phase error in response to the modified integrated output.

9. The radar apparatus of claim 1 further comprising a processor coupled to the ADC output modifier, and configured to determine a position and a velocity of the one or more obstacles from the N new samples.

10. A method comprising:
  generating a first signal in response to a reference clock and a feedback clock;
  transmitting the first signal, the first signal is scattered by one or more obstacles to generate a second signal;
  generating N samples corresponding to the second signal in a receive unit, and N is an integer; and
  generating N new samples from the N samples using an error between the feedback clock and the reference clock.

11. The method of claim 10 further comprising:
  generating a fractional division control word;
  generating an integer division control word from the fractional division control word;
  dividing the first signal by the integer division control word to generate the feedback clock;
  estimating the error between the feedback clock and the reference clock;
  generating a voltage signal in response to the error;
  filtering a high frequency noise from the voltage signal to generate a low frequency signal;
  generating the first signal in response to the low frequency signal; and
  amplifying the first signal.

12. The method of claim 10, wherein generating the N samples corresponding to the second signal in the receive unit further comprises:
  amplifying the second signal;
  mixing the second signal and the first signal to generate an IF (intermediate frequency) signal;
  filtering the IF signal to generate a filtered IF signal; and
  sampling the filtered IF signal.

13. The method of claim 11 further comprising:
  generating an instantaneous frequency error signal from the error between the reference clock and the feedback clock;
  filtering the instantaneous frequency error signal to generate a filtered frequency error signal;
  generating a new sampling time instants of the N samples from the filtered frequency error signal;
  estimating coefficients of a polynomial to be fitted to the N samples using the new sampling time instants; and
  resampling the N samples using the estimated coefficients and generating the N new samples.

14. The method of claim 13, wherein generating the instantaneous frequency error signal further comprises:
  converting the error between the feedback clock and the reference clock to a phase error;
  converting the phase error to a first signal phase error;
  estimating an additional phase error;
  subtracting the additional phase error from the first signal phase error to generate an instantaneous phase error; and
  differentiating the instantaneous phase error.

15. The method of claim 14 further comprising estimating the additional phase error from the fractional division control word and the integer division control word.

16. The method of claim 14, wherein estimating the additional phase error further comprises:
  dividing the fractional division control word by the integer division control word to generate a division ratio;
  subtracting the division ratio from one to generate a subtracted output;
  integrating the subtracted output for N samples to generate an integrated output;
  multiplying the integrated output by a constant to generate a modified integrated output; and
  delaying the modified integrated output.

17. The method of claim 10 further comprising determining a position and a velocity of the one or more obstacles from the N new samples.

18. The method of claim 10, wherein the reference clock is a constant frequency signal.

* * * * *